(12) United States Patent
Sato et al.

(10) Patent No.: US 9,576,907 B2
(45) Date of Patent: Feb. 21, 2017

(54) WIRING STRUCTURE AND METHOD OF MANUFACTURING THE SAME

(71) Applicant: FUJITSU LIMITED, Kawasaki-shi, Kanagawa (JP)

(72) Inventors: Shintaro Sato, Atsugi (JP); Daiyu Kondo, Atsugi (JP); Motonobu Sato, Isehara (JP); Mizuhisa Nihei, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/703,136

(22) Filed: May 4, 2015

(65) Prior Publication Data

US 2015/0235960 A1 Aug. 20, 2015

Related U.S. Application Data

(63) Continuation of application No. PCT/JP2013/065352, filed on Jun. 3, 2013.

(30) Foreign Application Priority Data

Nov. 7, 2012 (JP) .................................. 2012-245594

(51) Int. Cl.
*H01L 47/00* (2006.01)
*H01L 27/10* (2006.01)
(Continued)

(52) U.S. Cl.
CPC ... *H01L 23/53276* (2013.01); *H01L 21/76877* (2013.01); *H01L 23/5226* (2013.01); *H01L 23/53209* (2013.01)

(58) Field of Classification Search
CPC ......... B82Y 40/00; B82Y 10/00; B82Y 15/00; H01G 11/36; H01L 51/0048; H01L 51/444; Y10S 977/742; C01B 31/0293; H05K 2201/026

(Continued)

(56) References Cited

U.S. PATENT DOCUMENTS 8,710,672 B2 * 4/2014 Katagiri ............ H01L 21/76876
257/751
2008/0142989 A1 * 6/2008 Hayashi .............. H01L 21/7682
257/774

(Continued)

FOREIGN PATENT DOCUMENTS

JP H07-238000 9/1995
JP 2002-329723 A1 11/2002

(Continued)

OTHER PUBLICATIONS

M. Nihei, et al.; "Simultaneous Formation of Multiwall Carbon Nanotubes and their End-Bonded Ohmic Contacts to Ti Electrodes for Future ULSI Interconnects;" Japanese Journal of Applied Physics; vol. 43; No. 4B; 2004; pp. 1856-1859 (4 Sheets).

(Continued)

*Primary Examiner* — Hsien Ming Lee
(74) *Attorney, Agent, or Firm* — Kratz, Quintos & Hanson, LLP

(57) ABSTRACT

A wiring structure is made up by electrically connecting a via part made up by forming CNTs in a via hole and a wiring part made up of multilayer graphene on an interlayer insulating film via a metal block such as Cu. In the wiring structure using the CNTs at the via part and the graphene at the wiring part, it is thereby possible to obtain the wiring structure with high reliability enabling a certain electrical (Continued)

connection between the CNTs and the graphene with a relatively simple configuration.

19 Claims, 9 Drawing Sheets

(51) Int. Cl.
| | |
|---|---|
| *H01L 29/06* | (2006.01) |
| *H01L 21/20* | (2006.01) |
| *H01L 23/532* | (2006.01) |
| *H01L 23/522* | (2006.01) |
| *H01L 21/768* | (2006.01) |

(58) Field of Classification Search
USPC ...... 257/2, 4, 5, 52, 204, 618; 438/478, 482, 438/507, 509, 565, 584
See application file for complete search history.

(56) References Cited

U.S. PATENT DOCUMENTS

| | | | |
|---|---|---|---|
| 2011/0206934 A1* | 8/2011 | Bol | B82Y 30/00 428/408 |
| 2011/0284388 A1* | 11/2011 | Bae | C23C 18/1653 205/164 |
| 2013/0187097 A1* | 7/2013 | Hong | C23C 16/26 252/510 |

FOREIGN PATENT DOCUMENTS

| | | |
|---|---|---|
| JP | 2008-251701 A1 | 10/2008 |
| JP | 2009-070911 * | 4/2009 |
| JP | 2009-70911 A1 | 4/2009 |
| JP | 2009-283819 A1 | 12/2009 |
| JP | 2010-141046 A1 | 6/2010 |
| JP | 2011-32156 A1 | 2/2011 |
| JP | 2011-175996 A1 | 9/2011 |
| JP | 2012-60010 A1 | 3/2012 |

OTHER PUBLICATIONS

A. Naeemi, et al.; Performance Benchmarking for Graphene Nanoribbon, Carbon Nanotube, and Cu Interconnects; IEEE ITC; 2008; pp. 183-185 (3 Sheets)/p. 3 of specification.
D. Kondo, et al.; "Low-Temperature Synthesis of Graphene and Fabrication of Top-Gated Field Effect Transistors without Using Transfer Processes"; Applied Physics Express; vol. 3; 2010; pp. 025102-1-0215102-3 (3 Sheets)/p. 3 of specification.
A. Reina, et al.; "Large Area, Few-Layer Graphene Films on Arbitrary Substrates by Chemical Vapor Deposition; " Nano Letters; vol. 9; No. 1; 2009; pp. 30-35 (6 Sheets)/p. 3 of specification.
M. Zheng, et al.; "Metal-catalyzed crystallization of amorphous carbon to graphene;" Applied Physics Letters; vol. 96; 2010; pp. 063110-1-063110-3 and cover sheet (4 Sheets total)/Cited in International Search Report.
Written Opinion of the International Searching Authority for International Application No. PCT/JP2013/065352 (2 Sheets).
International Search Report for International Application No. PCT/JP2013/065352 dated Aug. 27, 2013.
TW office action dated Aug. 25, 2015, issued for Taiwanese patent application No. 102120108, with full translation.
Maxwell Zheng et al.,"Metal-catalyzed crystallization of amorphous carbon to graphene" , Applied Physics Letters, vol. 96, Feb. 12, 2010, p. 063110.
Office Action of TW Patent Application 102120108 dated Apr. 1, 2016, with full translation of the Office Action.
Office Action of JP Patent Application 2012-245594 dated Jul. 19, 2016. English translation of the relevant part, from p. 1, line 5 from the bottom to p. 4, line 23 of the Office Action.

* cited by examiner

WIRING STRUCTURE AND METHOD OF MANUFACTURING THE SAME

CROSS-REFERENCE TO RELATED APPLICATION

This application is a continuation application of International Application PCT/JP2013/065352 filed on Jun. 3, 2013 and designated the U.S., which claims the benefit of priority of the prior Japanese Patent Application No. 2012-245594, filed on Nov. 7, 2012, the entire contents of which are incorporated herein by reference.

FIELD

The embodiments discussed herein are directed to a wiring structure and a method of manufacturing the same.

BACKGROUND

In a current LSI, a multilayer wiring structure is generally applied. The wiring structure is made up by including a wiring part extending in a lateral direction on an interlayer insulating film and a via part in a vertical direction which fills a via hole of the interlayer insulating film with a conductive material, and electrically connects the wiring parts (between wirings at up and down). Copper (Cu) is mainly used as a wiring material of a leading-edge semiconductor device, and it is general to form the via part by filling and so on a metal material such as Cu in the via hole formed at a predetermined position so as to conduct with Cu wirings.

In recent years, it has been studied to use a carbon material including a cylindrical structure of carbon represented by so-called a carbon nanotube (CNT), a cylindrical carbon fiber, and so on in addition to the metal material such as Cu at the via part. In particular, the CNT has various properties such as excellent in chemical stability, and having peculiar physical and electrical characteristics, and so on, and therefore, it is watched as a forming material of a semiconductor device. As for the CNT, various studies have been continued up to now, for example, a forming position control, a chirality control, and so on in addition to controls of a size and a length thereof.

There is a configuration in which the wiring part of Cu is formed via a barrier film of Ta and so on which prevents Cu diffusion so as to cover the CNTs protruding from the via hole in the wiring structure using the CNTs at the via part (refer to Patent Literature 1, Non-Patent Literature 1). Besides, a configuration in which the wiring part is formed by using the CNTs is also proposed (Patent Literature 2). Further, a configuration in which a wiring is formed by using graphene, in particular a multilayer graphene is also proposed (Non-Patent Literature 2).

Patent Literature 1: Japanese Patent No. 4212258
Patent Literature 2: Japanese Laid-open Patent Publication No. 2008-251701
Non-Patent Literature 1: Nihei et al., Japan Journal of Applied Physics, Vol. 43 (2004) p. 1856
Non-Patent Literature 2: A. Naeemi and J. D. Meindl: Proc. of the 11th IEEE IITC (2008) p. 183
Non-Patent Literature 3: D. Kondo et al., Appl. Phys. Express, Vol. 3 (2010) p. 025102.
Non-Patent Literature 4: A. Reina et al., Nano Lett. Vol. 9 (2009) p. 30.

As stated above, the wiring structure in which the CNTs are used at the via part and the graphene is used at the wiring part is extremely effective for the LSI. However, there is a problem to be solved to enable the above. Actually, it is impossible to secure an enough electrical contact between the CNTs and the graphene only by overlapping the graphene on the CNTs. It is because a good connection is difficult to obtain only by pressing the CNTs and the graphene.

SUMMARY

In a wiring structure of the invention, carbon nanotubes and graphene are electrically connected via a metal block.

In a manufacturing method of a wiring structure of the invention, carbon nanotubes and graphene are electrically connected via a metal block.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, concrete various embodiments where the present invention is applied are described in detail with reference to the drawings.

(First Embodiment)

In the present embodiment, a wiring structure is disclosed together with a manufacturing method thereof. FIG. 1A to FIG. 2C are schematic sectional views illustrating the manufacturing method of the wiring structure according to a first embodiment in process sequence.

Figure 1A:
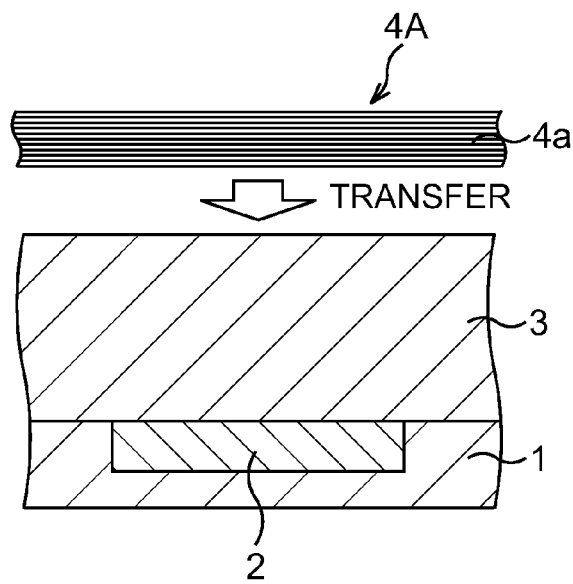
FIG. 1A is a schematic sectional view illustrating a manufacturing method of a wiring structure according to a first embodiment.

At first, as illustrated in FIG. 1A, a multilayer graphene 4A is transferred to a silicon substrate 1.

In detail, an interlayer insulating film 3 is formed to cover a conductive layer 2 on the silicon substrate 1 where the conductive layer 2 is formed on a surface thereof. The conductive layer 2 is, for example, a wiring layer, a silicide layer, or the like. The interlayer insulating film 3 is made up of, $SiO_2$, SiOC, a low dielectric constant material, and so on, and here, it is formed by depositing $SiO_2$ by, for example, the CVD method.

Next, the multilayer graphene 4A formed on an independent growth substrate is transferred on the interlayer insulating film 3. The multilayer graphene 4A is made up of graphene 4a stacked in multiple layers, and the number of layers of the graphene 4a is no object, but it is suitable to be within a range of approximately 1 layer to 10000 layers (a thickness is approximately 0.3 nm to approximately 3.4 µm). Here, a forming method of the graphene is no object. There are some methods, but there are the peeling off from a crystalline graphite, the chemical vapor deposition (CVD) method as representative ones. In the CVD method, the graphene is formed by a method described in, for example, Non-Patent Literature 3. Besides, a method described in, for example, Non-Patent Literature 4 is used as a transfer method when the CVD method is used.

Figure 1B:
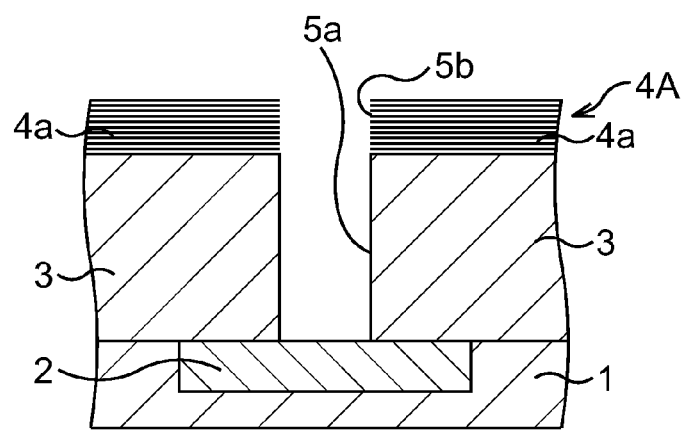
FIG. 1B is a schematic sectional view illustrating the manufacturing method of the wiring structure according to the first embodiment subsequent to FIG. 1A.

Subsequently, as illustrated in FIG. 1B, a via hole 5 is formed at the interlayer insulating film 3 and the multilayer graphene 4A.

In detail, a resist is coated on the multilayer graphene 4A, this resist is processed by the lithography, and a resist mask having an opening is formed. The etching, here, the reactive ion etching (RIE) is performed for the multilayer graphene 4A and the interlayer insulating film 3 until a part of a surface of the conductive layer 2 exposes by using this resist mask. Thereby, a via hole 5a which exposes a part of the surface of the conductive layer 2 at a bottom surface thereof is formed at the interlayer insulating film 3, and an opening 5b which is communicated with the via hole 5a is formed at the multilayer graphene 4A respectively.

Figure 1C:
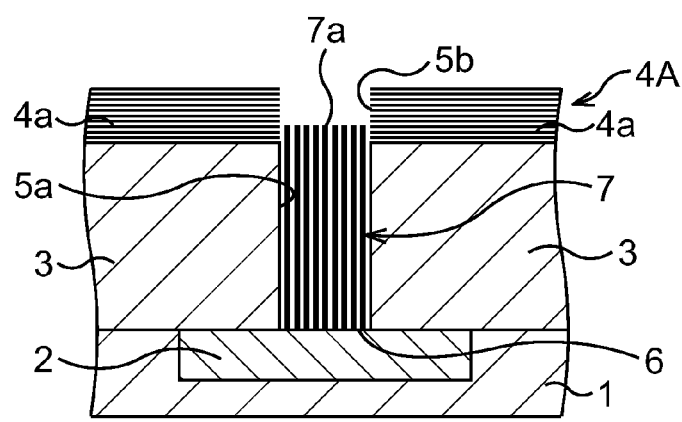
FIG. 1C is a schematic sectional view illustrating the manufacturing method of the wiring structure according to the first embodiment subsequent to FIG. 1B.

Subsequently, as illustrated in FIG. 1C, a via part 7 is formed.

In detail, at first, a catalyst 6 is deposited on the surface of the conductive layer 2 which is exposed at the bottom surface of the via hole 5a by, for example, the sputtering method. As the catalyst 6, it is a stacked structure of, for example, TaN, Ti, and Co (where TaN is a lowermost layer, Ti is an upper layer thereof, and Co is an uppermost layer). After that, the resist mask is removed together with TaN, Ti and Co on the resist mask by the ashing using oxygen plasma or the wet treatment using a chemical solution.

Next, carbon nanotubes (CNT) 7a are grown from the catalyst 6 on the bottom surface of the via hole 5a by the CVD method using, for example, mixed gas of acetylene and Ar. The via part 7 where an inside of the via hole 5a is embedded with the CNTs 7a is thereby formed.

Figure 2A:
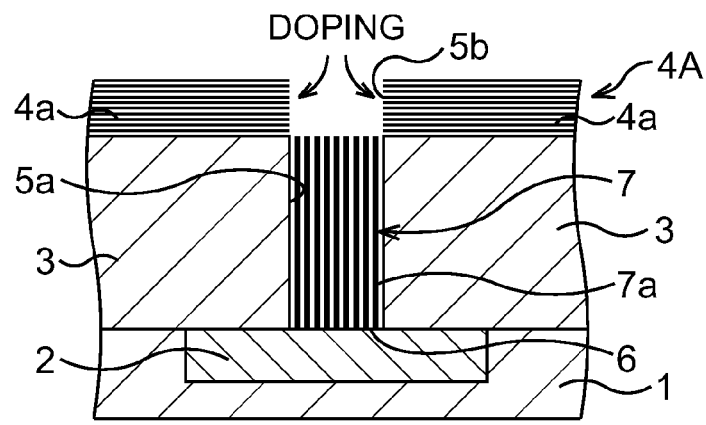
FIG. 2A is a schematic sectional view illustrating the manufacturing method of the wiring structure according to the first embodiment subsequent to FIG. IC.

Subsequently, as illustrated in FIG. 2A, an intercalation (doping) of different molecules is performed for the multilayer graphene 4A.

In detail, at first, the etching is appropriately performed for a part protruding from a surface of the interlayer insulating film 3 by the RIE as for the CNTs 7a of the via part 7.

Next, the intercalation of the different molecule is performed for the multilayer graphene 4A from a side surface of the opening 5b. The different molecules to be intercalated are not particularly limited, but it is desirable to use at least one kind selected from $FeCl_3$, K, Rb, Cs, Li, $HNO_3$, $SbCl_5$, $SbF_5$, $Br_2$, $AlCl_3$, $NiCl_2$, $AsF_5$ and $AuCl_3$. Here, for example, $FeCl_3$ is used. It becomes possible to largely lower an electrical resistance of the multilayer graphene 4A by this intercalation.

Figure 2B:
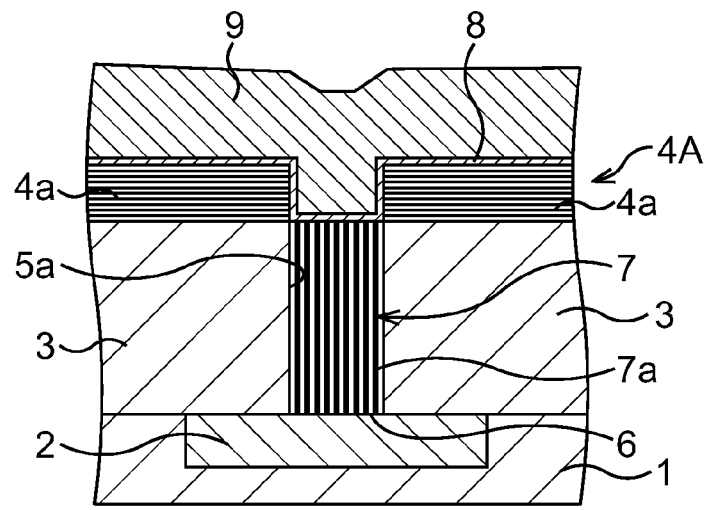
FIG. 2B is a schematic sectional view illustrating the manufacturing method of the wiring structure according to the first embodiment subsequent to FIG. 2A.

Subsequently, as illustrated in FIG. 2B, a barrier metal 8 and a metal 9 are deposited.

In detail, at first, the thin barrier metal 8 preventing diffusion of Cu is formed on the multilayer graphene 4A so as to be in contact with an upper surface of the CNTs 7a. The barrier metal 8 is a stacked structure of Ti and Ta (where Ti is a lower layer with a thickness of approximately 3 nm, and Ta is an upper layer with a thickness of approximately 5 nm) by, for example, the sputtering method. The barrier metal 8 also functions as a stopper at a polishing time of the later-described metal 9.

Next, a thin seed layer (for example, Cu) is formed on the barrier metal 8 by the sputtering method and so on. After that, the metal 9 to be a block which electrically connects the graphene and the CNTs is deposited so as to embed the opening 5b via the barrier metal 8 by the plating method or the sputtering method. The metal 9 is not particularly limited, but at least one kind selected from Cu, Ni, Co, Lu, Al, Ti, Ta, TiN and TaN, here, for example, Cu is deposited by the plating method.

Figure 2C:
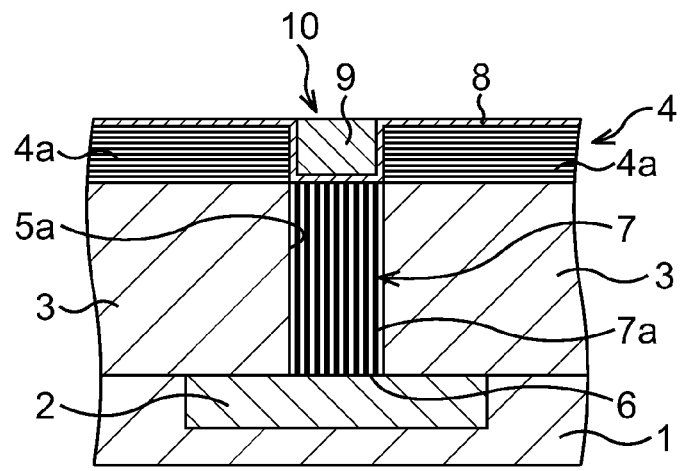
FIG. 2C is a schematic sectional view illustrating the manufacturing method of the wiring structure according to the first embodiment subsequent to FIG. 2B.

Subsequently, as illustrated in FIG. 2C, a metal block 10 is formed.

In detail, a part on the multilayer graphene 4A of the metal 9 is polished to be removed by the chemical mechanical polishing (CMP) method. Here, the barrier metal 8 under the metal 9 is used as a polishing stopper. As a result, the metal 9 remains only in the opening 5b, and the metal block 10 is formed. The barrier metal 8 remains on the multilayer graphene 4A. The metal block 10 is electrically connected to the CNTs 7a of the via hole 5a via the barrier metal 8.

After that, the barrier metal 8 and the multilayer graphene 4A are processed into a desired wiring shape by the lithography and the dry-etching. A wiring part 4 is thereby formed. A wiring structure in which the via part 7 made up by forming the CNTs 7a in the via hole 5a and the wiring part 4 made up of the multilayer graphene 4A on the interlayer insulating film 3 are electrically connected via the metal block 10 is thereby formed.

Note that a part on the multilayer graphene 4A of the barrier metal 8 may be removed by the CMP or the plasma etching using, for example, oxygen ($O_2$) and tetrafluoroethylene ($C_2F_4$). An appearance in which the wiring 4 where the barrier metal 8 at an upper surface is removed is formed is exemplified in FIG. 3. The barrier metal 8 on the multilayer graphene 4A is removed as stated above, and thereby, it is prevented that the barrier metal 8 is diffused into the wiring 4 as much as possible.

In the wiring structure of the embodiment, the via part 7 made up of the CNTs 7a and the wiring part 4 made up of the multilayer graphene 4A are electrically connected by the metal block 10. It is therefore possible to largely reduce a contact resistance between the CNTs 7a and the multilayer graphene 4A. When the wiring part on the interlayer insulating film is formed by a metal material such as Cu, there is fear that electromigration occurs, and therefore, the wiring part 4 is made up of the multilayer graphene 4A, and the metal block 10 is locally and restrictively disposed only at an electrical connection part between the via part 7 and the wiring part 4. It is thereby possible to suppress the occurrence of the electromigration as much as possible while largely reducing the contact resistance.

As described above, according to the present embodiment, a wiring structure with high reliability enabling a certain electrical connection between CNTs and graphene is enabled with a relatively simple configuration in the wiring structure using the CNTs at a via part and the graphene at a wiring part.

(Second Embodiment)

In the present embodiment, a wiring structure and a manufacturing method thereof are disclosed as same as the first embodiment, but it is different from the first embodiment in a point that a forming method of the via part is different. Note that the same reference numerals and symbols are supplied as for composing members and so on which are the same as the first embodiment.

FIG. 4A to FIG. 6C are schematic sectional views illustrating a manufacturing method of the wiring structure according to a second embodiment in process sequence.

Figure 4A:
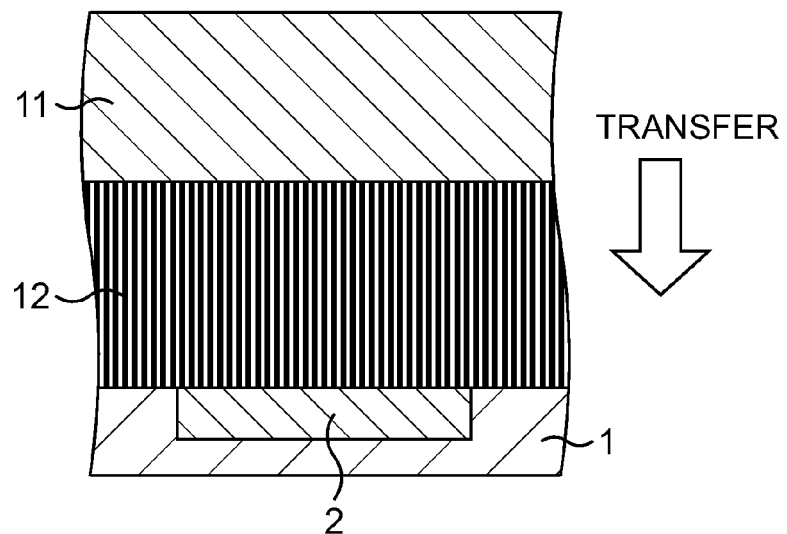
FIG. 4A is a schematic sectional view illustrating a manufacturing method of a wiring structure according to a second embodiment.

At first, as illustrated in FIG. 4A, CNTs 12 are transferred to the silicon substrate 1.

In detail, a metal for adhesion is deposited at an upper part of the orientation CNTs 12 formed on a growth substrate 11 independent from the silicon substrate 1 by the sputtering method and so on. This metal is not particularly limited, and it is, for example, a stacked structure of Ti, Ta and Au (Ti is a lower layer (which is in contact with the CNTs 12) with a thickness of approximately 3 nm, Ta is an intermediate layer with a thickness of approximately 5 nm, and Au is an upper layer with a thickness of approximately 10 nm).

Next, the CNTs 12 formed on the independent growth substrate are transferred on the silicon substrate 1 where the conductive layer 2 is formed at a surface. The conductive layer 2 is, for example, a wiring layer, a silicide layer, or the like.

The CNTs 12 are pressed on the silicon substrate 1 together with the growth substrate 11 via the metal for adhesion. A temperature is set to be approximately 250° C. under this state while applying pressure. The CNTs 12 are thereby transferred on the silicon substrate 1.

Figure 4B:
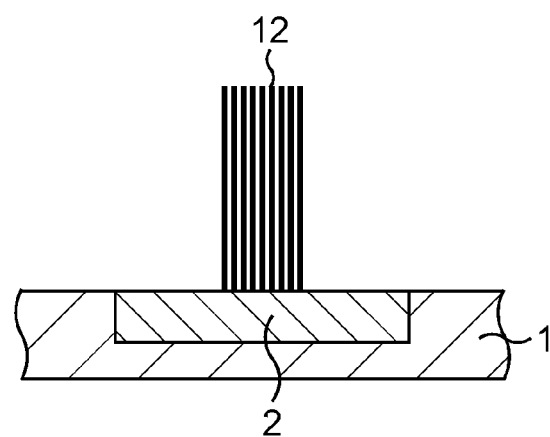
FIG. 4B is a schematic sectional view illustrating the manufacturing method of the wiring structure according to the second embodiment subsequent to FIG. 4A.

Subsequently, as illustrated in FIG. 4B, the CNTs 12 are etched.

In detail, extra parts of the CNTs 12 are removed by the lithography and the RIE, and the CNTs 12 are remained only at a predetermined portion on the conductive layer 2.

Figure 4C:
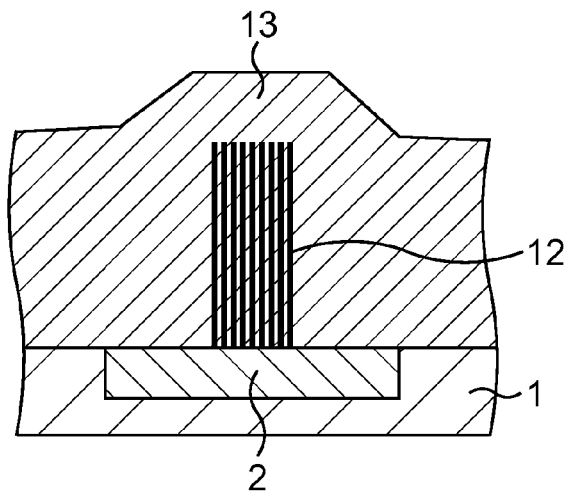
FIG. 4C is a schematic sectional view illustrating the manufacturing method of the wiring structure according to the second embodiment subsequent to FIG. 4B.

Subsequently, as illustrated in FIG. 4C, an interlayer insulating film 13 is formed.

In detail, the interlayer insulating film 13 is formed on the silicon substrate 1 so as to embed the CNTs 12. The interlayer insulating film 13 is made up of $SiO_2$, SiOC, a low dielectric constant material, and so on, and here, for example, a predetermined low dielectric constant material is coated on the silicon substrate 1. After the coating, the low dielectric constant material is annealing processed.

Figure 5A:
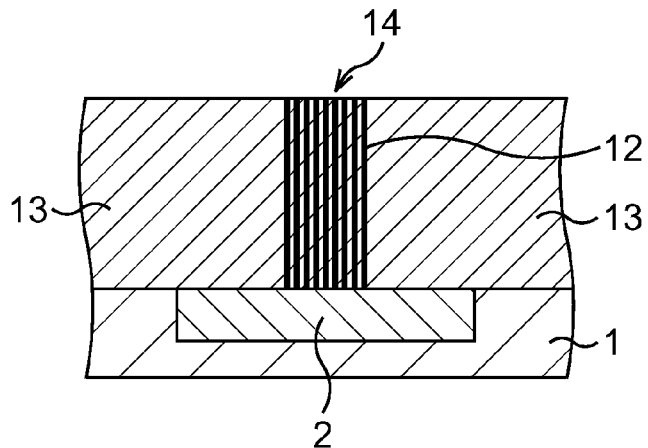
FIG. 5A is a schematic sectional view illustrating the manufacturing method of the wiring structure according to the second embodiment subsequent to FIG. 4C.

Subsequently, as illustrated in FIG. 5A, a via part 14 is formed.

In detail, a surface of the interlayer insulating film 13 and tip parts of the CNTs 12 are polished by the CMP. The surface of the interlayer insulating film 13 and upper parts of the CNTs 12 are thereby planarized, and the via part 14 is formed. At the via part 14, gaps between adjacent CNTs 12 are embedded by the low dielectric constant material of the interlayer insulating film 13, and tips of the CNTs 12 are exposed from an upper surface thereof.

Figure 5B:
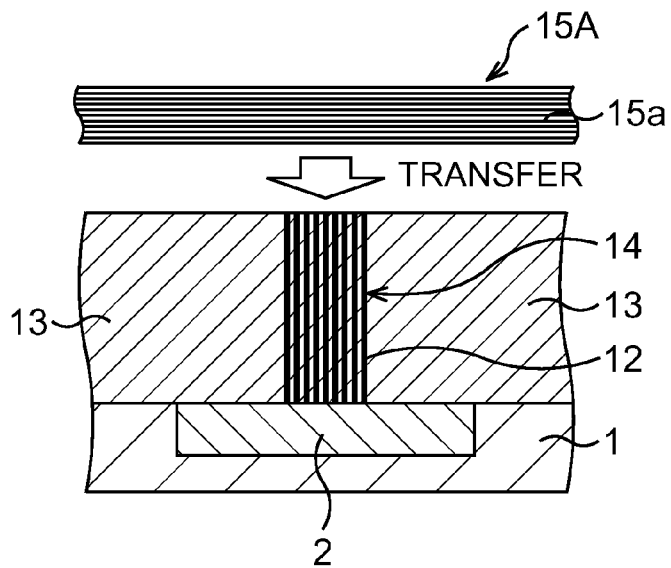
FIG. 5B is a schematic sectional view illustrating the manufacturing method of the wiring structure according to the second embodiment subsequent to FIG. 5A.

Subsequently, as illustrated in FIG. 5B, a multilayer graphene 15A is transferred.

In detail, the multilayer graphene 15A formed on an independent growth substrate is transferred on the interlayer insulating film 13 including on the via part 14. The multilayer graphene 15A is made up by stacking graphene 15a in multiple layers. The number of layers of the graphene 15a is no object, but it is suitable to be within a range of approximately one layer to 10000 layers (a thickness thereof is approximately 0.3 nm to approximately 3.4 μm). Here, a forming method of the graphene is no object. There are some methods, but there are the peeling off from the crystalline graphite, and the chemical vapor deposition (CVD) method as representative ones. In the CVD method, the graphene is formed by the method described in, for example, Non-Patent Literature 3. Besides, the method described in, for example, Non-Patent Literature 4 is used as the transfer method when the CVD method is used.

Figure 5C:
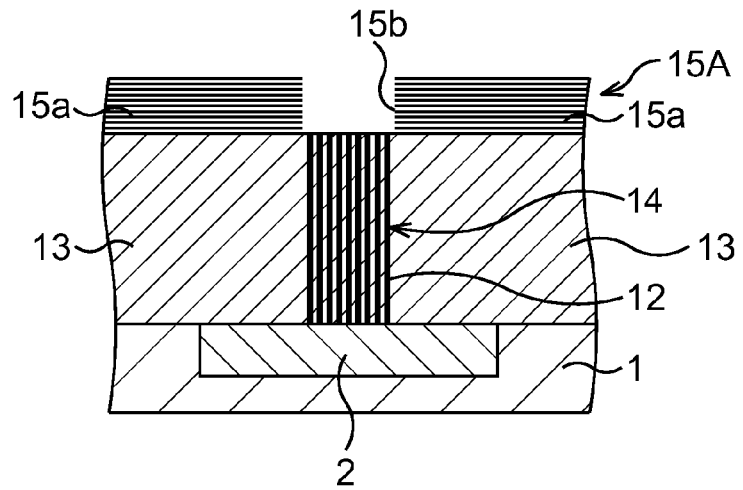
FIG. 5C is a schematic sectional view illustrating the manufacturing method of the wiring structure according to the second embodiment subsequent to FIG. 5B.

Subsequently, as illustrated in FIG. 5C, an opening 15b is formed at the multilayer graphene 15A.

In detail, a resist is coated on the multilayer graphene 15A, this resist is processed by the lithography, and a resist mask having an opening is formed. The etching, here, the RIE is performed for the multilayer graphene 15A until a part of an upper surface of the via part 14 exposes by using this resist mask. Thereby, the opening 15b which exposes the upper surface of the via part 14 at a bottom surface thereof is formed at the multilayer graphene 15A.

Figure 6A:
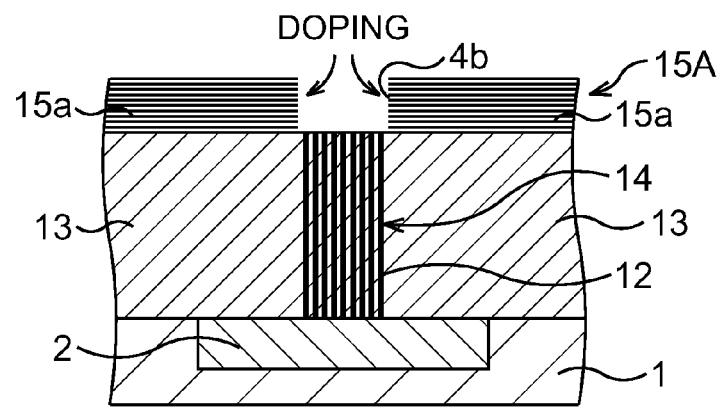
FIG. 6A is a schematic sectional view illustrating the manufacturing method of the wiring structure according to the second embodiment subsequent to FIG. 5C.

Subsequently, as illustrated in FIG. 6A, the intercalation (doping) of a different molecule is performed for the multilayer graphene 4A.

In detail, the intercalation of the different molecule is performed for the multilayer graphene 15A from a side surface which is exposed by the opening 15b. The different molecule to be intercalated is not particularly limited, but it is desirable to use at least one kind selected from $FeCl_3$, K, Rb, Cs, Li, $HNO_3$, $SbCl_5$, $SbF_5$, $Br_2$, $AlCl_3$, $NiCl_2$, $AsF_5$ and $AuCl_3$. Here, for example, $Br_2$ is used. It becomes possible to largely lower an electrical conductivity of the multilayer graphene 15A by this intercalation.

Figure 6B:
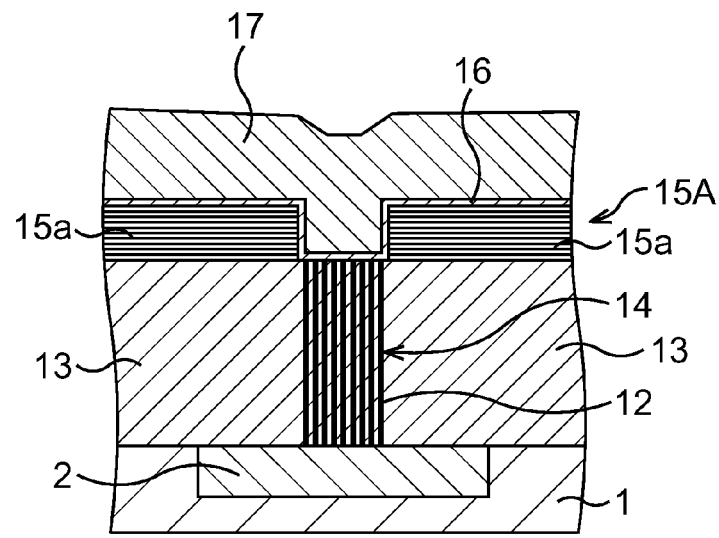
FIG. 6B is a schematic sectional view illustrating the manufacturing method of the wiring structure according to the second embodiment subsequent to FIG. 6A.

Subsequently, as illustrated in FIG. 6B, a barrier metal 16 and a metal 17 are deposited.

In detail, at first, a thin barrier metal 16 preventing diffusion of Cu is formed on the multilayer graphene 15A so as to be in contact with upper surfaces of the CNTs 12 of the via part 14 and to cover an inner wall of the opening 15b. The barrier metal 16 is a stacked structure of Ti and Ta (where Ti is a lower layer with a thickness of approximately 3 nm, and Ta is an upper layer with a thickness of approximately 5 nm) by, for example, the sputtering method. The barrier metal 16 also functions as a stopper at a later-described polishing time of the metal 17.

Next, after a thin seed layer (for example, Cu) is formed on the barrier metal 16 by the sputtering method and so on, the metal 17 to be a block connecting the graphene and the CNTs is deposited by the plating method, the sputtering method, or the like. The metal 17 is not particularly limited, but at least one kind selected from Cu, Ni, Co, Lu, Al, Ti, Ta, TiN and TaN, here, for example, Cu is deposited by the plating method.

Figure 6C:
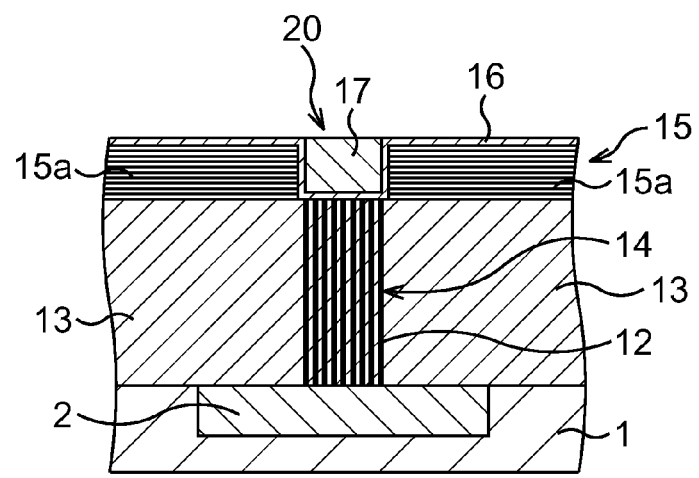
FIG. 6C is a schematic sectional view illustrating the manufacturing method of the wiring structure according to the second embodiment subsequent to FIG. 6B.

Subsequently, as illustrated in FIG. 6C, a metal block 20 is formed.

In detail, a part on a multilayer graphene 17A of the metal 17 is polished to be removed by the CMP method. Here, the barrier metal 16 under the metal 17 is used as a polishing stopper. As a result, the metal 17 remains only in the opening 15a on the via part 14, and the metal block 20 is formed. The barrier metal 16 remains on the multilayer graphene 15A. The metal block 20 is electrically connected to the CNTs 12 of the via part 14 via the barrier metal 16.

After that, the barrier metal 16 and the multilayer graphene 15A are processed into a desired wiring shape by the lithography and the dry-etching. A wiring part 15 is thereby formed. A wiring structure in which the via part 14 made up of the CNTs 12 and the wiring part 15 made up of the multilayer graphene 15A on the interlayer insulating film 13 are electrically connected via the metal block 20 is thereby formed.

Figure 7:
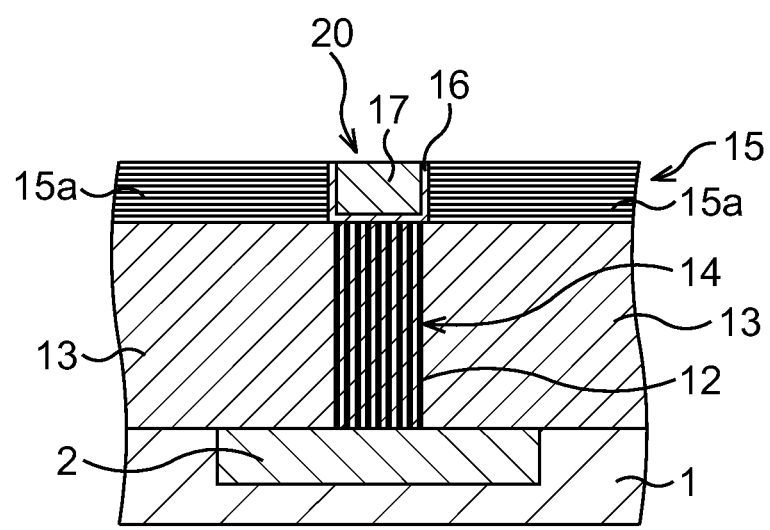
FIG. 7 is a schematic sectional view illustrating another example of the wiring structure according to the second embodiment.

Note that a part on the multilayer graphene 15A of the barrier metal 16 may be removed by the CMP or the plasma etching using, for example, oxygen ($O_2$) and tetrafluoroethylene ($C_2F_4$). An appearance where the barrier metal 16 at an upper surface is removed and the barrier metal 16 remains only at the opening 15a is exemplified in FIG. 7. The barrier metal 16 on the multilayer graphene 15A is removed as stated above, and thereby, it is prevented that the barrier metal 16 diffuses into the wiring 15 as much as possible.

In the wiring structure of the embodiment, the via part 14 made up of the CNTs 12 and the wiring part 15 made up of the multilayer graphene 15A are electrically connected by the metal block 20. It is therefore possible to largely reduce a contact resistance between the CNTs 12 and the multilayer graphene 15A. When the wiring part on the interlayer insulating film is formed by the metal material such as Cu, there is fear that electromigration occurs, and therefore, the wiring part 15 is made up of the multilayer graphene 15A, and the metal block 20 is locally and restrictively disposed only at an electrical connection part between the via part 14 and the wiring part 15. It is thereby possible to suppress the occurrence of the electromigration as much as possible while largely reducing the contact resistance.

Further, in the embodiment, the CNTs 12 are transferred on the silicon substrate 1, and therefore, it is not necessary to consider an effect of a temperature at a forming time of the CNTs 12 on the multilayer graphene, the interlayer insulating film, and so on. Accordingly, it is not necessary to suppress the temperature at the forming time of the CNTs 12 into a low temperature, and it is possible to grow the CNTs 12 at a desired high temperature (for example, at approximately 1000° C.), and to grow the high quality CNTs 12. A further low resistant carbon wiring structure is thereby enabled.

As described above, according to the embodiment, the wiring structure with high reliability enabling the certain electrical connection between the CNTs and the graphene is enabled with a relatively simple configuration by using the high quality CNTs in the wiring structure where the CNTs are used at the via part and the graphene is used at the wiring part.

(Third Embodiment)

In the present embodiment, a wiring structure and a manufacturing method thereof are disclosed as same as the first embodiment, but it is different from the first embodiment in a point that a forming method of the multilayer graphene is different. Note that the same reference numerals and symbols are supplied as for composing members and so on which are the same as the first embodiment.

FIG. 8A to FIG. 8D are schematic sectional views illustrating a major process of a manufacturing method of the wiring structure according to a third embodiment.

Figure 8A:
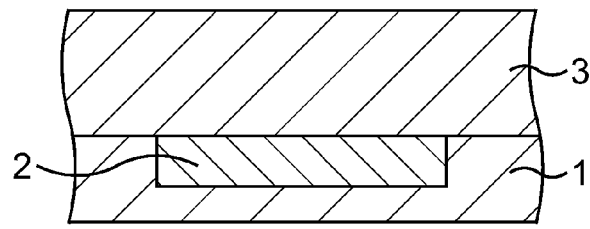
FIG. 8A is a schematic sectional view illustrating a major process of a manufacturing method of a wiring structure according to a third embodiment.

At first, as illustrated in FIG. 8A, the silicon substrate 1 where the conductive layer 2 is formed at the surface is prepared. The conductive layer 2 is, for example, a wiring layer, a silicide layer, or the like.

Figure 8B:
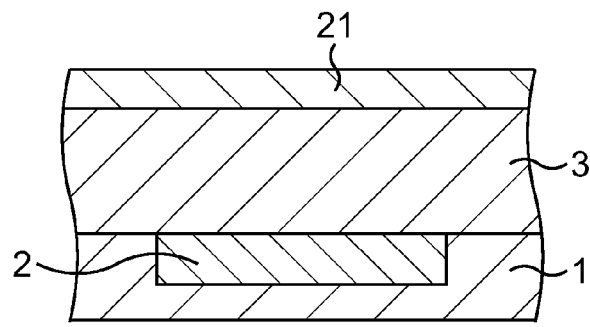
FIG. 8B is a schematic sectional view illustrating the major process of the manufacturing method of the wiring structure according to the third embodiment subsequent to FIG. 8A.

Subsequently, as illustrated in FIG. 8B, an amorphous carbon layer 21 is formed.

In detail, amorphous carbon is deposited on the silicon substrate 1 for a thickness of, for example, approximately 30 nm by the sputtering method and so on. The amorphous carbon layer 21 is thereby formed.

Figure 8C:
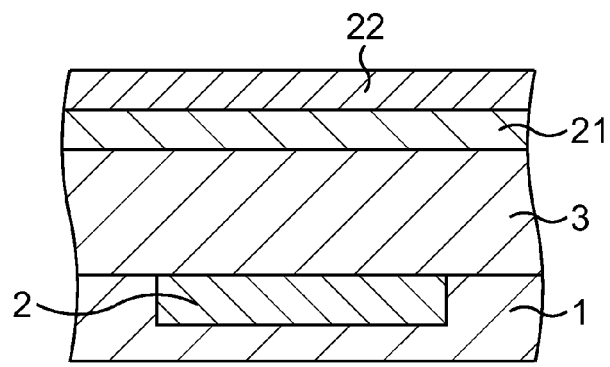
FIG. 8C is a schematic sectional view illustrating the major process of the manufacturing method of the wiring structure according to the third embodiment subsequent to FIG. 8B.

Subsequently, as illustrated in FIG. 8C, a metal layer 22 is formed.

In detail, a metal is deposited on the amorphous carbon layer 21 by the sputtering method or the vapor deposition method. The metal layer 22 is thereby formed. As the metal, there can be cited at least one kind selected from Ni, Co, Fe, Cu, Au, Pt, Lu, Ti, Ta, or an alloy thereof and so on. Here, Co is selected. A thickness of Co is not limited, but it is set to be within a range of, for example, approximately 5 nm to approximately 10000 nm, and here, it is set to be approximately 50 nm.

Figure 8D:
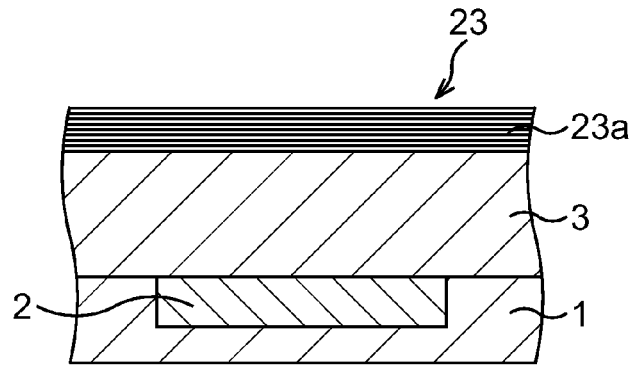
FIG. 8D is a schematic sectional view illustrating the major process of the manufacturing method of the wiring structure according to the third embodiment subsequent to FIG. 8C.

Subsequently, as illustrated in FIG. 8D, a multilayer graphene 23 is formed.

In detail, the silicon substrate 1 is set in an annealing furnace, and the amorphous carbon layer 21 and the metal layer 22 are annealing processed. A heating atmosphere is in vacuum, in inert gas such as argon, nitrogen, in hydrogen, in forming gas, or the like, but here, it is performed in the nitrogen atmosphere. A heating temperature is within a range of approximately 200° C. to approximately 1000° C., and a heating time is, for example, approximately for 30 minutes. Here, the heating temperature is desirable to be approximately 450° C. or less to prevent damages of transistors and a low dielectric constant film used as an insulating film under the wiring structure. Besides, an RTA device performing a heating for a very short period of time may be used. The amorphous carbon layer 21 under the metal layer 22 is alternated into the multilayer graphene 23 by this annealing process. The multilayer graphene 23 has a constitution in which a plurality of graphenes 23a are stacked. After the annealing process, the silicon substrate 1 is treated with a predetermined etching solution (hydrochloric acid, iron chloride solution, and so on), and the metal layer 22 on the multilayer graphene 23 is removed. As stated above, in the embodiment, it is possible to directly form the multilayer graphene 23 on the interlayer insulating film 3.

After that, various processes in FIG. 1B to FIG. 2C are sequentially performed as same as the first embodiment. As a result, the wiring structure where the via part 7 made up by forming the CNTs 7a in the via hole 5a and the wiring part made up of the multilayer graphene 23 on the interlayer insulating film 3 are electrically connected via the metal block 10 is formed.

In the wiring structure according to the embodiment, the via part 7 made up of the CNTs 7a and the wiring part made up of the multilayer graphene 23 are electrically connected via the metal block 10. Therefore, it is possible to largely reduce the contact resistance between the CNTs 7a and the multilayer graphene 23. When the wiring part on the interlayer insulating film is formed with the metal material such as Cu, there is fear that electromigration occurs, and therefore, the wiring part is made up of the multilayer graphene 23, and the metal block 10 is locally and restrictively disposed only at an electrical connection part between the via part 7 and the wiring part. It is thereby possible to suppress the occurrence of the electromigration as much as possible while largely reducing the contact resistance.

As described above, according to the embodiment, the wiring structure with high reliability enabling the certain electrical connection between the CNTs and the graphene is enabled with a relatively simple configuration in the wiring structure where the CNTs are used at the via part and the graphene is used at the wiring part.

(Fourth Embodiment)

In the present embodiment, a case when the wiring structure disclosed in any of the first embodiment to the third embodiment, here, the wiring structure disclosed in the first embodiment is applied to a wiring structure of a MOS transistor is exemplified. Note that the same reference numerals and symbols are supplied as for composing members and so on which are the same as the first embodiment.

Figure 9A:
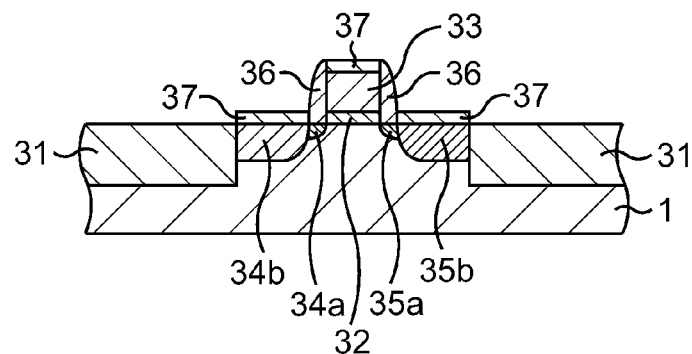
FIG. 9A is a schematic sectional view illustrating a manufacturing method of a MOS transistor according to a fourth embodiment.
Figure 9B:
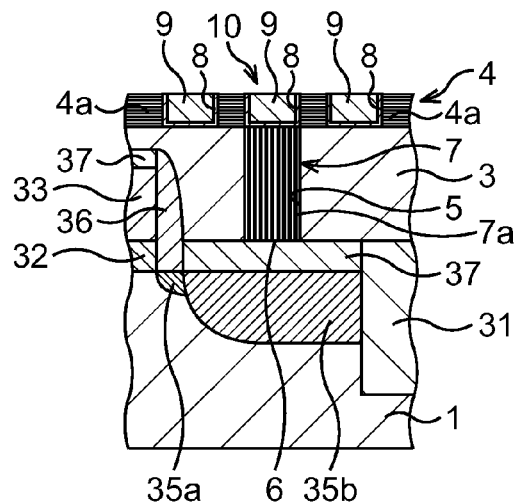
FIG. 9B is a schematic sectional view illustrating the manufacturing method of the MOS transistor according to the fourth embodiment subsequent to FIG. 9A.
Figure 9C:
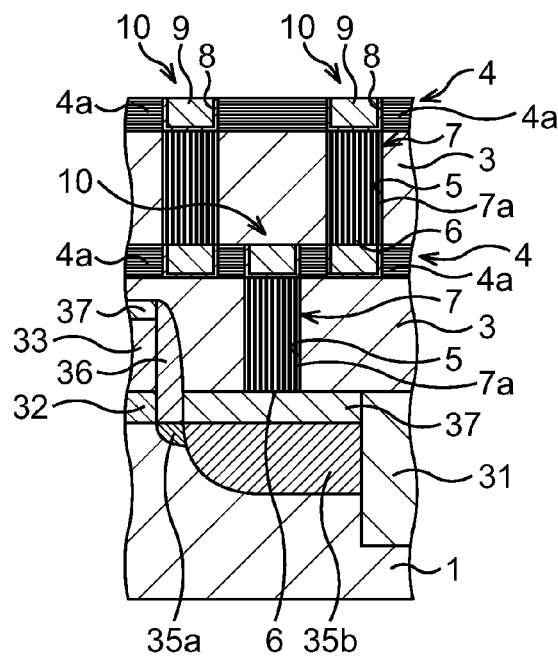
FIG. 9C is a schematic sectional view illustrating the manufacturing method of the MOS transistor according to the fourth embodiment subsequent to FIG. 9B.

FIG. 9A to FIG. 9C are schematic sectional views illustrating a manufacturing method of a MOS transistor according to a fourth embodiment in process sequence.

At first, as illustrated in FIG. 9A, a transistor element is formed on the silicon substrate 1 as a functional element.

In detail, an element isolation structure 31 is formed on a surface layer of the silicon substrate 1 by, for example, the STI (Shallow Trench Isolation) method to determine an element active region.

Next, for example, a silicon oxide film is deposited at the element active region by thermal oxidation and so on by the CVD method, and for example, a polycrystalline silicon film is deposited on the silicon oxide film by the CVD method. The polycrystalline silicon film and the silicon oxide film are processed into electrode shapes by the lithography and the dry-etching subsequent thereto. A gate electrode 33 is thereby formed on a gate insulating film 32.

Next, a predetermined conductive type impurity is ion-implanted into both sides of the gate electrode 33 at the element active region. So-called extension regions 34a, 35a are thereby formed.

Next, for example, a silicon oxide film is deposited on a whole surface by the CVD method, and this silicon oxide film is so-called etch-backed. The silicon oxide film thereby remains only at a side surface of the gate electrode 33, and a sidewall insulating film 36 is formed.

Next, a conductive-type impurity which is the same as the extension regions 34a, 35a is ion-implanted into both sides of the gate electrode 33 and the sidewall insulating film 36 at the element active region. A source region 34b and a drain region 35b which are partly overlapped with the extension regions 34a, 35a are thereby formed.

Next, a silicide metal, for example, Co, Ni, or the like is deposited on a whole surface by the sputtering method and so on, and the annealing process is performed. Si at upper surfaces of the gate electrode 33, the source region 34b and the drain region 35b, and the silicide metal are thereby reacted, and a silicide layer 37 is formed. Then an unreacted silicide metal is removed by the wet treatment using a predetermined chemical solution.

A transistor element is thereby formed.

Subsequently, as illustrated in FIG. 9B, the wiring structure according to the first embodiment is formed.

Figure 3:
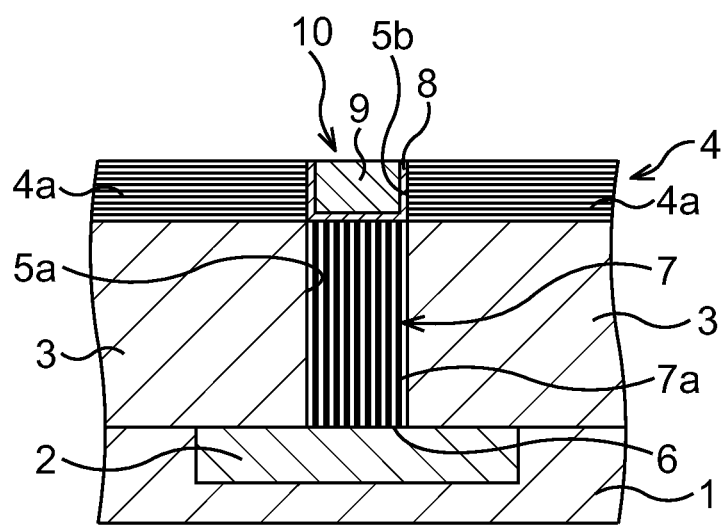
FIG. 3 is a schematic sectional view illustrating another example of the wiring structure according to the first embodiment.

In detail, various processes in FIG. 1A to FIG. 2B of the first embodiment are sequentially performed. In the example illustrated in the drawing, a case when a plurality (here, three pieces) of via parts 7 are formed in parallel in a vicinity of the drain region 35b is illustrated. Subsequent to the process in FIG. 2B, the process in FIG. 3 is performed.

A wiring structure made up by electrically connecting one of the paralleled via parts 7 with the drain region 35b via the silicide layer 37 (which corresponds to the conductive layer 2 in the first embodiment) is thereby formed. In FIG. 9B, only the wiring structure which is formed on the silicide layer 37 of the drain region 35b is exemplified.

Subsequently, as illustrated in FIG. 9C, the wiring structure according to the first embodiment is further formed to make it a multilayer wiring.

In detail, structures each including the via parts 7, the wiring part 4 and the metal block 10 are stacked in a plurality of layers. Namely, various processes in FIG. 1A to FIG. 2B and FIG. 3 of the first embodiment are sequentially performed again. The wiring structure made up by electrically connecting the via parts 7 with a wiring layer 4 (which corresponds to the conductive layer 2 in the first embodiment) via the metal block 10 is thereby formed. In FIG. 9C, only a multilayer wiring structure formed at upward of the silicide layer 37 of the drain region 35b is exemplified. In the example in the drawing, the multilayer wiring structure in two layers is illustrated, but the wiring structure is stacked and formed into further multiple layers.

As described above, according to the embodiment, the MOS transistor including the wiring structure with high reliability enabling the certain electrical connection between the CNTs and the graphene is enabled.

According to the present invention, it is possible to obtain a wiring structure with high reliability enabling a certain electrical connection between CNTs and graphene with a relatively simple configuration in the wiring structure using the CNTs at a via part and the graphene at a wiring part.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

According to the present invention, it is possible to obtain a wiring structure with high reliability enabling a certain electrical connection between CNTs and graphene with a relatively simple configuration in the wiring structure using the CNTs at a via part and the graphene at a wiring part.

What is claimed is:

1. A wiring structure comprising:
    carbon nanotubes;
    a graphene; and
    a metal block,
    wherein the metal block comprises a metal and a barrier metal, which covers a first face and a second face of the metal and an upper face of the graphene;
    the carbon nanotubes are formed on the first face via the barrier metal and is electrically connected to the metal, in a state where the carbon nanotubes are in non-physical contact with the first face; and
    the graphene is formed on the second face via the barrier metal and is electrically connected to the metal, in a state where the graphene is in non-physical contact with the second face.

2. The wiring structure according to claim 1,
    wherein the graphene is made up by being stacked in a plurality of layers.

3. The wiring structure according to claim 1,
    wherein the carbon nanotubes, the graphene and the metal block are stacked in a plurality of layers.

4. The wiring structure according to claim 1,
    wherein the metal block contains at least one kind selected from the group consisting of Cu, Ni, Co, Lu, Al, Ti, Ta, TiN and TaN.

5. The wiring structure according to claim 1,
    wherein a multilayer graphene is intercalated by different molecules.

6. The wiring structure according to claim 5,
    wherein the different molecule is at least one kind selected from the group consisting of $FeCl_3$, K, Rb, Cs, Li, $HNO_3$, $SbCl_5$, $SbF_5$, $Br_2$, $AlCl_3$, $NiCl_2$, $AsF_5$ and $AuCl_3$.

7. The wiring structure according to claim 1,
    wherein the carbon nanotubes are formed in an opening formed at an insulating film on a substrate.

8. The wiring structure according to claim 1,
    wherein the carbon nanotubes are formed by being embedded in an insulating film on a substrate.

9. A manufacturing method of a wiring structure, comprising:
    electrically connecting carbon nanotubes and graphene via a metal block,
    wherein the metal block comprises a metal and a barrier metal, which covers a first face and a second face of the metal and an upper face of the graphene;
    the carbon nanotubes are formed on the first face via the barrier metal and is electrically connected to the metal, in a state where the carbon nanotubes are in non-physical contact with the first face; and
    the graphene is formed on the second face via the barrier metal and is electrically connected to the metal, in a state where the graphene is in non-physical contact with the second face.

10. The manufacturing method of the wiring structure according to claim 9, further comprising:
    stacking the graphene in a plurality of layers to be formed.

11. The manufacturing method of the wiring structure according to claim 9, further comprising:
    stacking structures each including the carbon nanotubes, the graphene and the metal block in a plurality of layers.

12. The manufacturing method of the wiring structure according to claim 9,
    wherein the metal block contains at least one kind selected from the group consisting of Cu, Ni, Co, Lu, Al, Ti, Ta, TiN and TaN.

13. The manufacturing method of the wiring structure according to claim 9,
    wherein a multilayer graphene is intercalated by different molecules.

14. The manufacturing method of the wiring structure according to claim 13, further comprising:
    forming an opening at the multilayer graphene;
    intercalating the different molecules into the multilayer graphene via the opening; and
    embedding the metal block in the opening after the intercalation.

15. The manufacturing method of the wiring structure according to claim 13,
    wherein the different molecule is at least one kind selected from the group consisting of $FeCl_3$, K, Rb, Cs, Li, $HNO_3$, $SbCl_5$, $SbF_5$, $Br_2$, $AlCl_3$, $NiCl_2$, $AsF_5$ and $AuCl_3$.

16. The manufacturing method of the wiring structure according to claim 9,
    wherein the graphene is obtained by a transfer from an independent substrate.

17. The manufacturing method of the wiring structure according to claim 9,
    wherein the graphene is obtained by performing a heat treatment of an amorphous carbon film where a metal film is stacked.

18. The manufacturing method of the wiring structure according to claim 9,
    wherein the carbon nanotubes are formed in an opening formed at an insulating film on a substrate.

19. The manufacturing method of the wiring structure according to claim 9,
    wherein the carbon nanotubes are formed by being embedded in an insulating film on a substrate.

* * * * *